United States Patent
Birkhahn

(10) Patent No.: US 8,269,253 B2
(45) Date of Patent: Sep. 18, 2012

(54) RARE EARTH ENHANCED HIGH ELECTRON MOBILITY TRANSISTOR AND METHOD FOR FABRICATING SAME

(75) Inventor: Ronald H. Birkhahn, Minneapolis, MN (US)

(73) Assignee: International Rectifier Corporation, El Segundo, CA (US)

( * ) Notice: Subject to any disclaimer, the term of this patent is extended or adjusted under 35 U.S.C. 154(b) by 87 days.

(21) Appl. No.: 12/455,933

(22) Filed: Jun. 8, 2009

(65) Prior Publication Data

US 2010/0308375 A1 Dec. 9, 2010

(51) Int. Cl.
*H01L 31/102* (2006.01)
(52) U.S. Cl. ........... 257/189; 257/200; 257/E29.246; 257/E21.403; 438/309; 438/584
(58) Field of Classification Search ............ 257/184, 257/188, 189, 192, 194, 197, 200, 201, E29.246, 257/E29.247, E29.248, E29.252, E21.403, 257/E21.407; 438/309, 312, 313, 584, 597, 438/602, 604
See application file for complete search history.

(56) References Cited

U.S. PATENT DOCUMENTS

| 5,248,890 A | 9/1993 | Luth |
| 5,314,547 A | 5/1994 | Heremans |
| 5,322,813 A | 6/1994 | Beach |
| 5,646,425 A | 7/1997 | Beach |
| 5,847,437 A | 12/1998 | Chang |
| 6,087,702 A | 7/2000 | Chang |
| 6,225,200 B1 | 5/2001 | Chang |
| 6,255,669 B1* | 7/2001 | Birkhahn et al. ............... 257/89 |
| 6,406,930 B2 | 6/2002 | Birkhahn |
| 7,745,852 B2* | 6/2010 | Teraguchi ............... 257/194 |
| 7,786,503 B2* | 8/2010 | D'Evelyn et al. ............ 257/103 |
| 2007/0120129 A1 | 5/2007 | DenBaars |
| 2007/0269913 A1* | 11/2007 | Kim et al. ............... 438/22 |
| 2009/0218589 A1* | 9/2009 | Zimmerman et al. ............ 257/99 |

FOREIGN PATENT DOCUMENTS

| EP | 1 979 956 A1 | 10/2008 |
| JP | 3291943 (A) | 12/1991 |
| WO | WO 2005/022580 A1 | 3/2005 |
| WO | WO 2008/024991 A2 | 2/2008 |

* cited by examiner

*Primary Examiner* — Olik Chaudhuri
*Assistant Examiner* — Su Kim
(74) *Attorney, Agent, or Firm* — Farjami & Farjami LLP

(57) ABSTRACT

According to one embodiment, a high electron mobility transistor (HEMT) comprises an insulator layer comprising a first group III-V intrinsic layer doped with a rare earth additive. The HEMT also comprises a second group III-V intrinsic layer formed over the insulator layer, and a group III-V semiconductor layer formed over the second group III-V intrinsic layer. In one embodiment, a method for fabricating a HEMT comprises forming a first group III-V intrinsic layer and doping the first group III-V intrinsic layer with a rare earth additive to produce an insulator layer. The method also comprises forming a second group III-V intrinsic layer over the insulator layer, and further forming a group III-V semiconductor layer over the second group III-V intrinsic layer. A two-dimensional electron gas (2DEG) is formed at a heterojunction interface of the group III-V semiconductor layer and the second group III-V intrinsic layer.

18 Claims, 4 Drawing Sheets

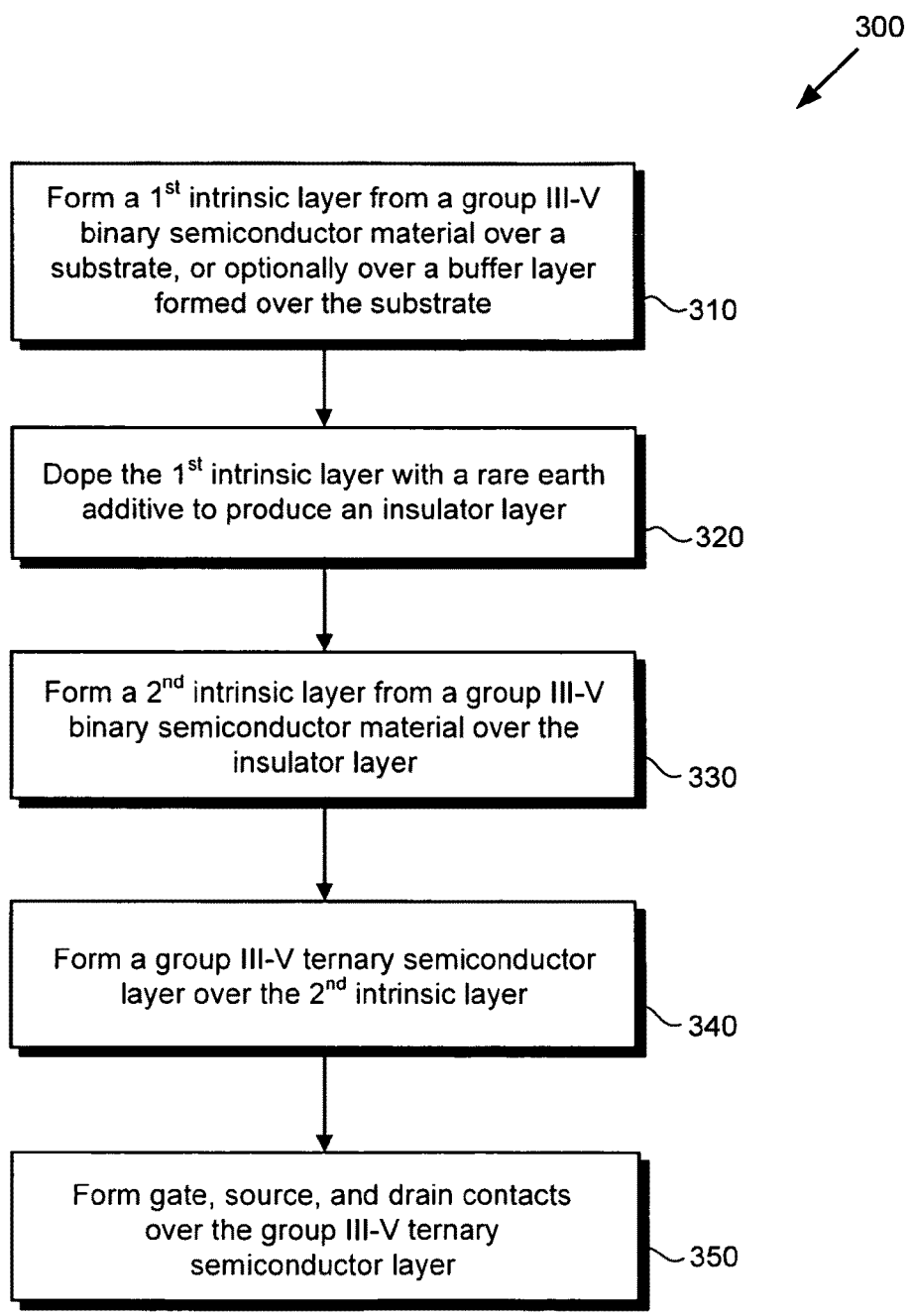

US 8,269,253 B2

RARE EARTH ENHANCED HIGH ELECTRON MOBILITY TRANSISTOR AND METHOD FOR FABRICATING SAME

BACKGROUND OF THE INVENTION

1. Field of the Invention

The present invention is generally in the field of semiconductor devices and their fabrication. More specifically, the present invention is in the field of high electron mobility transistors and their fabrication.

2. Background Art

Many prevalent electronic devices and systems continue to require faster switching speeds and greater power handling capabilities. Examples of such electronic devices and systems are semiconductor based switching and amplification devices employed in, for example, wireless communications such as W-CDMA (wideband code division multiple access) base stations and the like.

One solution to the increased device performance demands has been the development and implementation of high electron mobility transistors (HEMTs), such as the heterostructure field effect transistor, or HFET. In a typical HFET, a two-dimensional electron gas (2DEG) is generated at a semiconductor heterojunction. The 2DEG represents a very thin conduction layer of highly mobile and highly concentrated charge carriers free to move readily in the two dimensions of that conduction layer, but constrained from movement in a third dimension perpendicular to the conduction layer.

In practice, the ability of an HFET to perform well at high frequency and/or at high power, depends in part on the characteristics of the 2DEG generated at the semiconductor heterojunction. In particular, where charge carriers are insufficiently constrained from moving away from, or dispersing out of, the thin conduction layer, for example by movement perpendicular to the conduction layer towards the device substrate, device performance is adversely affected. Unfortunately, conventional approaches to HFET fabrication have either failed to provide optimal charge carrier constraint within the 2DEG, or in seeking to improve confinement of the charge carriers, have produced other undesirable results negatively impacting device performance.

Thus, there is a need to overcome the drawbacks and deficiencies in the art by providing a HEMT, such as an HFET, exhibiting more effective containment of charge carriers by preventing charge carrier migration out of the semiconductor active region.

SUMMARY OF THE INVENTION

Rare earth enhanced high electron mobility transistors and method for fabricating same, substantially as shown in and/or described in connection with at least one of the figures, as set forth more completely in the claims.

BRIEF DESCRIPTION OF THE DRAWINGS

FIG. 3 is a flowchart presenting a method for fabricating an HFET doped with a rare earth additive, according to one embodiment of the present invention.

DETAILED DESCRIPTION OF THE INVENTION

Figure 1:
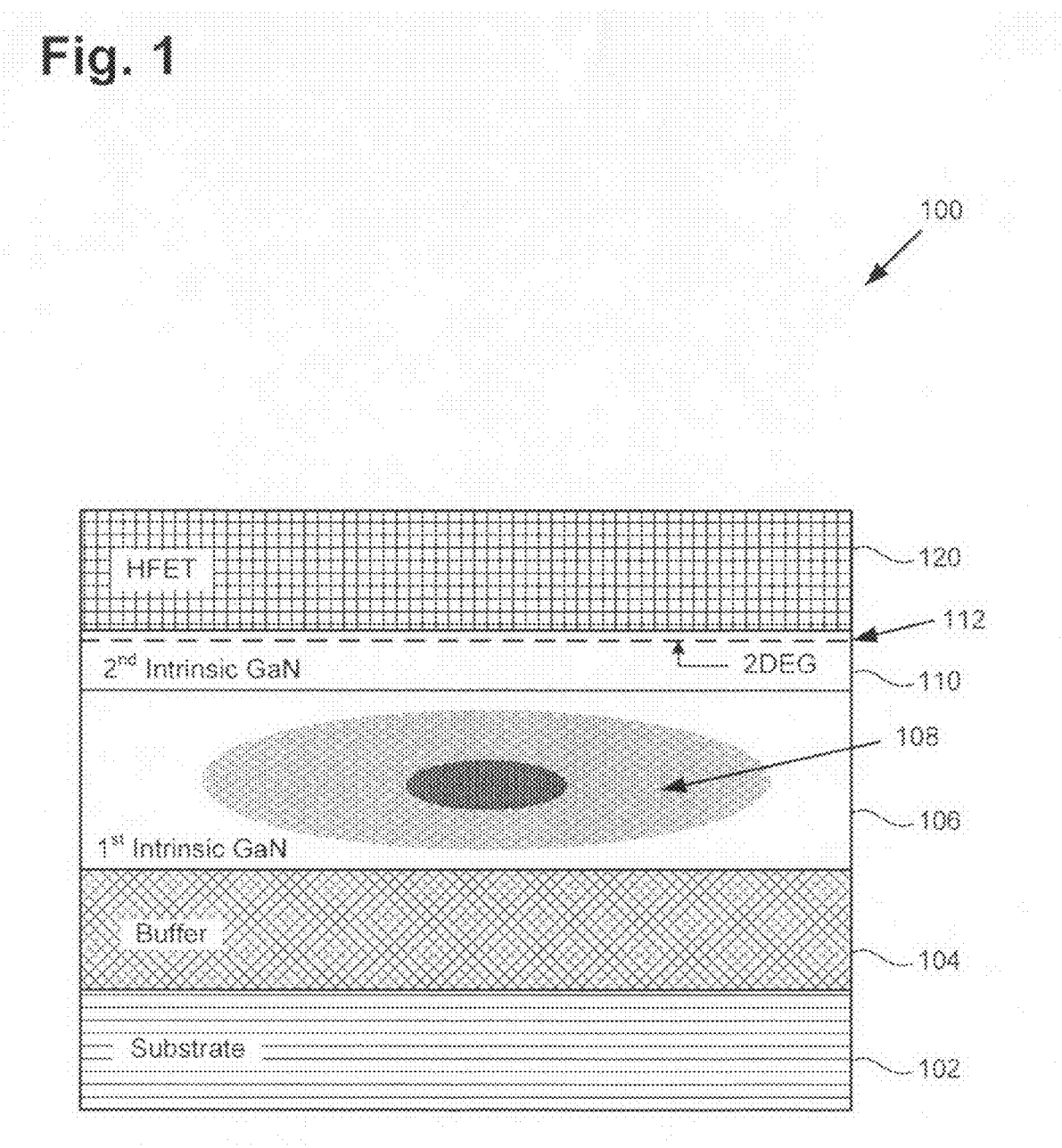
FIG. 1 is a block diagram showing a conventional heterostructure field effect transistor (HFET).

The present invention is directed to rare earth enhanced high electron mobility transistors (HEMTs) and method for fabrication of same. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely example embodiments of the invention. To maintain brevity, other embodiments of the invention, which use the principles of the present invention, are not specifically described in the present application and are not specifically illustrated by the present drawings. It should be borne in mind that, unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 is a block diagram showing a conventional heterostructure field effect transistor (HFET). Conventional structure 100, in FIG. 1, includes substrate 102, buffer layer 104, first intrinsic gallium nitride (GaN) layer 106 including optional conventional dopant 108, second intrinsic GaN layer 110, two-dimensional electron gas (2DEG) 112, and HFET 120. 2DEG 112, which provides a conduction channel for the charge carriers of HFET 120, is generated at the heterojunction formed by the interface of HFET 120 and second intrinsic GaN layer 110.

2DEG 112 represents a very thin conduction channel populated by highly mobile and highly concentrated charge carriers that are free to move in the two dimensions of 2DEG 112, but, ideally, are constrained from movement in a third dimension perpendicular to 2DEG 112, for example, into first intrinsic GaN layer 106. In theory, the charge carriers of 2DEG 112 could be nearly perfectly contained within the conduction channel, if first intrinsic GaN layer 106 were sufficiently insulating. Furthermore, in theory, a perfectly formed first intrinsic GaN layer 106 might produce an adequately insulating layer to assure charge confinement.

In conventional practice, however, formation of first intrinsic GaN layer 106 unavoidably introduces defects into the lattice structure of first intrinsic GaN layer 106 (defects not represented in FIG. 1), which result in undesirable charge carrier leakage from 2DEG 112 into first intrinsic GaN layer 106. A conventional approach to reducing charge carrier leakage into first intrinsic GaN layer 106 attempts to improve the dielectric properties of first intrinsic GaN layer 106 by doping first intrinsic GaN layer 106 with conventional dopant 108. Thus, in some conventional embodiments, conventional dopant 108, which typically comprises one of carbon, iron, or magnesium, maybe doped into first intrinsic GaN layer 106, while in other conventional embodiments conventional dopant 108 may not be present in first intrinsic GaN layer 106.

Although conventional dopant 108 can act to neutralize charge carriers originating in 2DEG 112, each species of dopant typically utilized as conventional dopant 108 introduces its own potential undesirable consequences. For example, when conventional dopant 108 comprises carbon, the carbon can form deep-level traps in first intrinsic GaN layer 106 that are conductive, rather than enhancing the dielectric barrier presented by GaN layer 106. Alternatively, when conventional dopant 108 comprises iron, the in-chamber memory effect of iron during formation of first intrinsic GaN layer 106 may produce tailing of conventional dopant 108, making it difficult to desirably control distribution of conventional dopant 108 in first intrinsic GaN layer 106.

When, instead of carbon or iron, conventional dopant 108 comprises magnesium, there is a risk of activation of conventional dopant 108. Activation of conventional dopant 108 containing magnesium may result from heating during an annealing process, for example, and can result in first intrinsic GaN layer 106 assuming undesirably p-type semiconductor properties. Thus, each of the conventional approaches to preventing leakage of charge carriers from 2DEG 112 into first intrinsic GaN layer 106, i.e., use of an undoped intrinsic GaN layer 106, or use of conventional dopant 108 comprising one of carbon, iron, or magnesium to dope first intrinsic GaN layer 106, fails to optimally achieve the desired result.

Figure 2A:
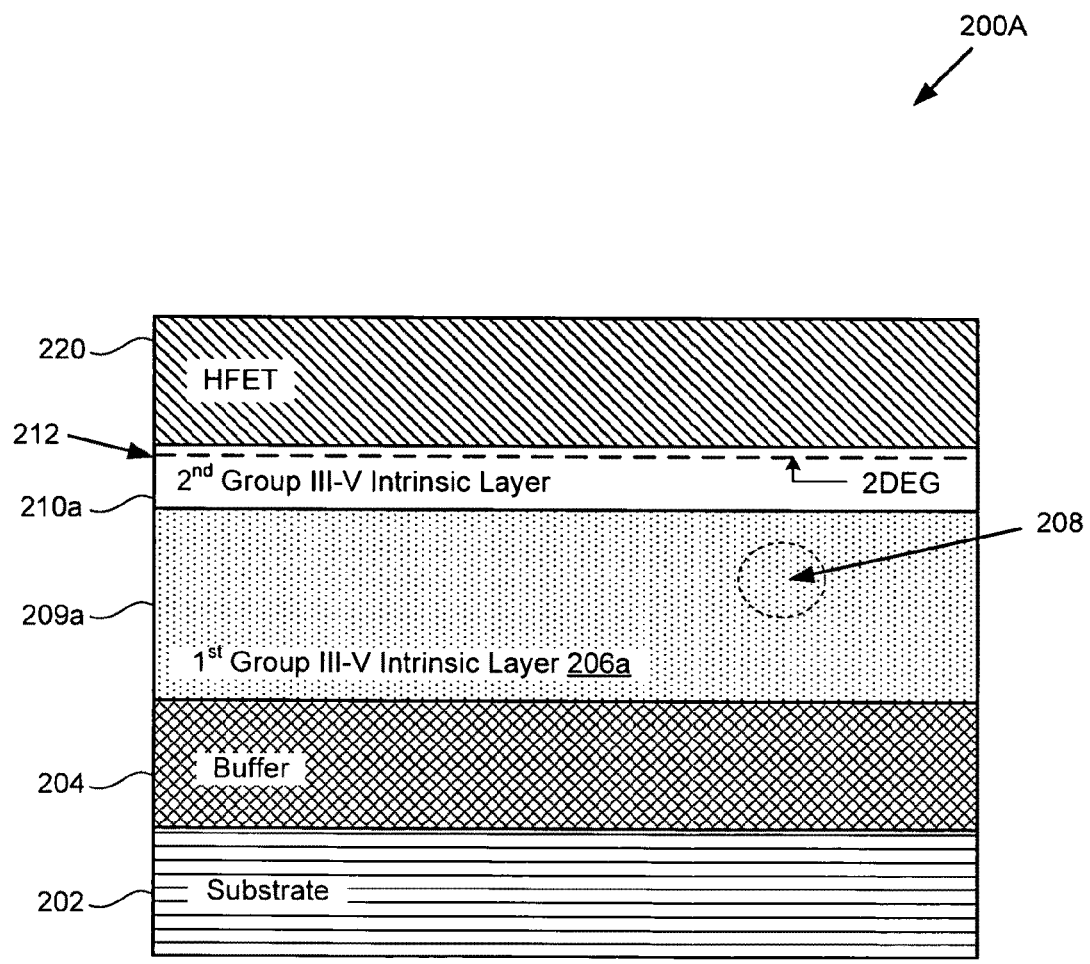
FIG. 2A is a block diagram showing a rare earth enhanced HFET structure, according to one embodiment of the present invention.

Turning to FIG. 2A, FIG. 2A is a block diagram showing a rare earth enhanced HFET structure, according to one embodiment of the present invention, that succeeds in overcoming the drawbacks and deficiencies of conventional structures. Structure 200A, in FIG. 2A, comprises substrate 202, buffer layer 204, insulator layer 209a formed from first group III-V intrinsic layer 206a doped with rare earth additive 208, second group III-V intrinsic layer 210a, 2DEG 212, and HFET 220. 2DEG 212, which provides a conduction channel for the charge carriers of HFET 220, is generated at the heterojunction formed by the interface of HFET 220 and second group III-V intrinsic layer 210a.

Substrate 202 may comprise any commonly utilized substrate material, such as sapphire, silicon, or silicon carbide, for example. As shown by FIG. 2A, in the present embodiment, first group III-V intrinsic layer 206a is formed over buffer layer 204, which is itself formed over substrate 202. It is noted that the present embodiment is merely one representation of a rare earth enhanced HEMT, however, and in other embodiments, buffer layer 204 may not be utilized. For example, where substrate 202 is a suitable native substrate for first group III-V intrinsic layer 206a, that layer (i.e. layer 206a) may be formed directly on substrate 202, eliminating buffer layer 204 entirely. Where, however, as in the present embodiment buffer layer 204 is used, buffer layer 204 may comprise any material providing an appropriate environment for growth of first group III-V intrinsic layer 206a. In instances in which first group III-V intrinsic layer 206a comprises a binary group III-V semiconductor material such as GaN, for example, a suitable material for buffer layer 204 might be GaN, aluminum nitride (AlN), or zinc oxide (ZnO).

First group III-V intrinsic layer 206a and second group III-V intrinsic layer 210a may each comprise any of several combinations of elements selected from groups III and V of the Periodic Table. Moreover, first group III-V intrinsic layer 206a and second group III-V intrinsic layer 210a may in some embodiments comprise the same group III-V intrinsic material, and in other embodiments each comprise different group III-V intrinsic materials. For example, first group III-V intrinsic layer 206a and/or second group III-V intrinsic layer 210a may comprise a binary semiconductor such as indium nitride (InN) or gallium arsenide (GaAs), or a wide bandgap binary semiconductor such as GaN, AlN, or boron nitride (BN), for example. Alternatively, first group III-V intrinsic layer 206a and/or second group III-V intrinsic layer 210a may comprise a ternary semiconductor, such as aluminum gallium nitride (AlGaN), for example.

First group III-V intrinsic layer 206a is, as its name suggests, intrinsic, for instance by virtue of being left undoped. As an intrinsic group III-V material, first group III-V intrinsic layer 206a is nominally insulating. However, due to the largely unavoidable presence of crystal defects, produced during epitaxial growth of first group III-V intrinsic layer 206a, for example, first group III-V intrinsic layer 206a may be less than optimally insulating when implemented to support operation of HFET 220. As a result, without enhancement of its intrinsic insulating properties, first group III-V intrinsic layer 206 may allow the leakage of charge carriers from 2DEG 212 associated with deficiencies in the conventional art.

As shown by FIG. 2A, however, according to the present embodiment, first group III-V intrinsic layer 206a is doped with rare earth additive 208 to produce insulator layer 209a so as to advantageously reduce leakage of charge carriers away from 2DEG 212. The expression "rare earth" may be interpreted in more than one way, as is commonly recognized in the art. Consequently, for the purposes of the present application, a rare earth element is defined to be a member of the lanthanide or actinide series, exclusive respectively of lanthanum and actinium. In other words, a rare earth element, as used herein, refers to any one of the elements assigned atomic numbers fifty-eight (58) through seventy-one (71) inclusive, and atomic numbers ninety (90) through one hundred and three (103) inclusive.

Rare earth additive 208 may comprise any one or more of the above described rare earth elements. That is to say, rare earth additive may comprise a single substantially pure rare earth element, such as cerium (Ce), praseodymium (Pr), europium (Eu), erbium (Er), or thulium (Tm), or a combination of two or more substantially pure rare earth elements, for example. Although an optimal concentration for rare earth additive 208 in first group III-V intrinsic layer 206a may vary according to the specific implementational details of structure 200A, in some embodiments, an effective concentration of rare earth additive 208 may be found at greater than 0.0 atomic percent and less than or equal to 1.0 atomic percent, for example.

Figure 2B:
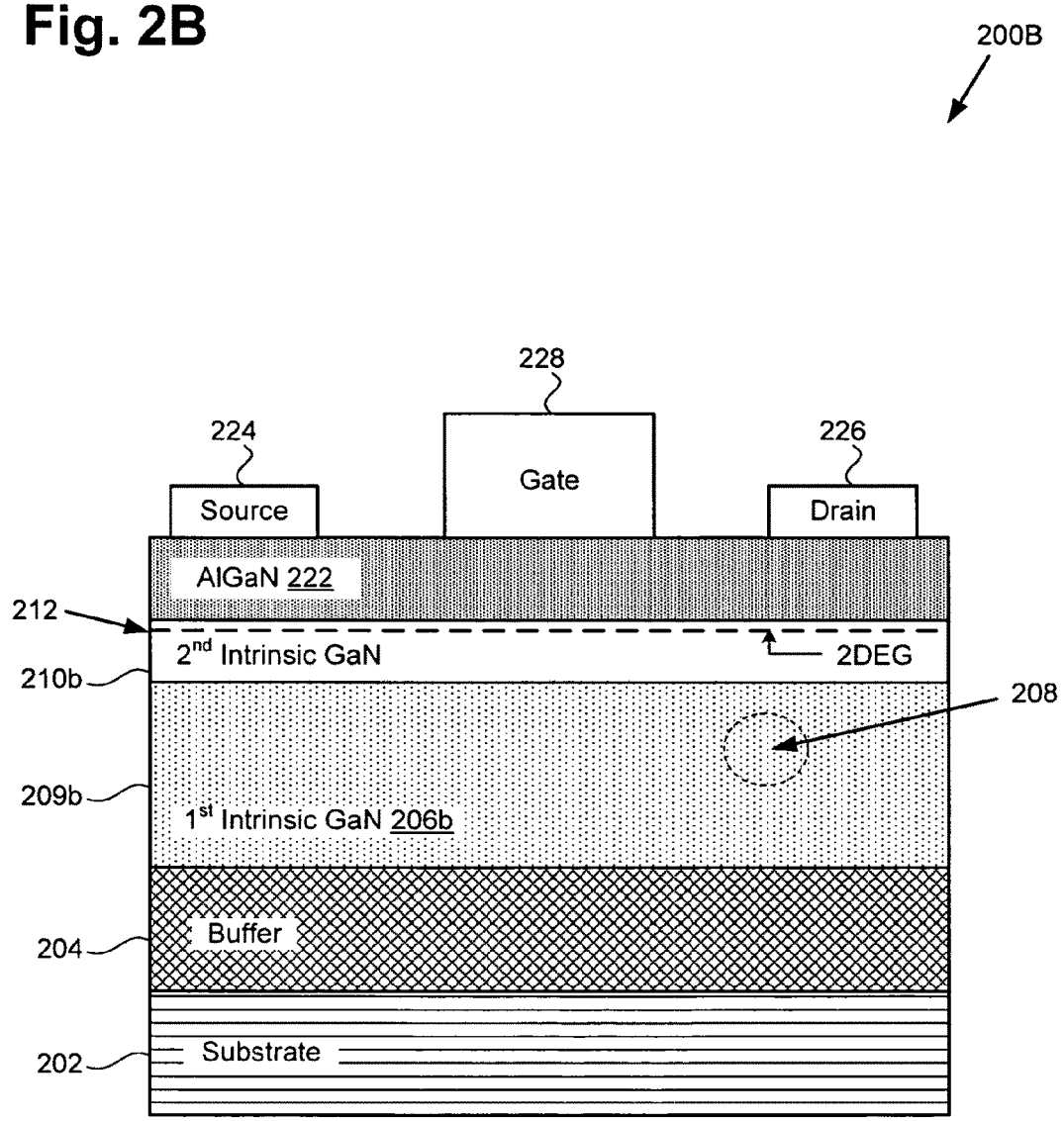
FIG. 2B shows a more specific example of the rare earth enhanced HFET structure of FIG. 2A, according to one embodiment of the present invention.

The benefits and advantages of the present invention will now be further described by reference to FIG. 2B and FIG. 3. FIG. 2B shows a more specific example of the rare earth enhanced HFET structure of FIG. 2A, according to one embodiment of the present invention, while FIG. 3 shows flowchart 300 describing the steps, according to one embodiment of the present invention, of a method for fabricating an HFET doped with a rare earth additive. Certain details and features have been left out of flowchart 300 that are apparent to a person of ordinary skill in the art. For example, a step may comprise one or more substeps or may involve specialized equipment or materials, as known in the art. While steps 310 through 350 indicated in flowchart 300 are sufficient to describe one embodiment of the present invention, other embodiments of the invention may utilize steps different from those shown in flowchart 300.

Structure 200B, in FIG. 2B, generally corresponds to structure 200A, in FIG. 2A, and includes substrate 202, buffer layer 204, rare earth additive 208, and 2DEG 212, all shown in that previous figure. In addition, structure 200B comprises insulator layer 209b including first intrinsic GaN layer 206b doped with rare earth additive 208, and second intrinsic GaN layer 210b formed over insulator layer 209b, corresponding respectively to insulator layer 209a including first group III-V intrinsic layer 206a doped with rare earth additive 208, and second group III-V intrinsic layer 210a formed over insulator layer 209a, in FIG. 2A. Also shown in FIG. 2B are AlGaN layer 222 formed over second intrinsic GaN layer 210b so as to produce 2DEG 212 at a heterojunction interface of AlGaN layer 222 and second intrinsic GaN layer 210b, as well as source contact 224, drain contact 226, and gate contact 228. Collectively, AlGaN layer 222, source contact 224, drain contact 226, and gate contact 228 correspond to HFET 220, in FIG. 2A.

Beginning with step 310 of flowchart 300 and referring to FIG. 2B, step 310 of flowchart 300 comprises forming a first intrinsic layer from a group III-V binary semiconductor material over a substrate, or optionally over a buffer layer formed over the substrate. In FIG. 2B, step 310 corresponds to forming first intrinsic GaN layer 206b over substrate 202, or optionally over buffer layer 204 formed over substrate 202. As there is presently no available native substrate for formation of GaN, implementation of the embodiment shown in FIG. 2B may include buffer layer 204 today. However, it is contemplated that when a suitable substrate for formation of GaN is developed, some embodiments of the present invention corresponding to structure 2B may not include buffer layer 204.

Although the present embodiment represents the first intrinsic layer as comprising a group III-V binary semiconductor, e.g., GaN, more generally, the first intrinsic layer may comprise any appropriate group III-V material. The first intrinsic layer, e.g., first intrinsic GaN layer 206b, in FIG. 2B, may be formed in step 310 using any of a number of conventional production techniques. For example, first intrinsic GaN layer 206b may be formed using molecular beam epitaxy (MBE), metal-organic chemical vapor deposition (MOCVD), or hydride vapor phase epitaxy (HVPE), to name a few suitable formation techniques.

Continuing with step 320 of FIG. 3, step 320 of flowchart 300 comprises doping the first intrinsic layer with a rare earth additive to produce an insulator layer. Referring to FIG. 2B once again, step 320 corresponds to doping first intrinsic GaN layer 206b with rare earth additive 208 to produce insulator layer 209b. Doping of first intrinsic GaN layer 209b with rare earth additive 208 may proceed in situ, or through ion implantation, for example. An effective doping concentration of rare earth additive 208 to produce insulator layer 209b from first intrinsic GaN layer 206b may include rare earth additive concentrations ranging from 0.0 atomic percent up to and including 1.0 atomic percent, for example.

Step 330 of flowchart 300 comprises forming a second intrinsic layer from a group III-V binary semiconductor material over the insulator layer. In the embodiment of FIG. 2B, step 330 corresponds to forming second intrinsic GaN layer 210b over insulator layer 209b. Although the present embodiment represents the second intrinsic layer of step 330 as comprising a group III-V binary semiconductor, e.g., second intrinsic GaN layer 210b, more generally, the second intrinsic layer may comprise any suitable group III-V semiconductor material, and may include a group III-V ternary semiconductor, for example.

Continuing with step 340 of flowchart 300, step 340 comprises forming a group III-V ternary semiconductor layer over the second intrinsic layer. Step 340 corresponds to formation of AlGaN layer 222 over second intrinsic GaN layer 210b, as shown in FIG. 2B. As further shown in FIG. 2B, the combination of AlGaN layer 222 and second intrinsic GaN layer 210b can result in generation of 2DEG 212 at a heterojunction formed by their interface. Once again, although the present embodiment recites formation of a group III-V ternary semiconductor layer, e.g., AlGaN layer 222, in step 340, more generally, step 340 may comprise formation of any suitable group III-V semiconductor layer, that in combination with the underlying second intrinsic layer formed in step 330, is capable of generating 2DEG 212 at their heterojunction interface.

Subsequent to step 340, fabrication of rare earth enhanced HFET structure 200B continues with formation of gate, source, and drain contacts over the group III-V ternary semiconductor layer, in step 350. Referring again to FIG. 2B, step 350 corresponds to formation of gate contact 228, source contact 224, and drain contact 226, over AlGaN layer 222. As a result of steps 310 through 350 shown by flowchart 300 in FIG. 3, an HFET, or more generally a HEMT structure displaying reduced leakage of its charge carriers is provided. Although not expressly described in conjunction with flowchart 300, other embodiments of the present method may include additional processes, such as annealing, for example. Annealing may be especially desirable in embodiments in which doping of the first intrinsic layer with a rare earth additive to produce an insulator layer, in step 320, proceeds through ion implantation.

From the above description of the invention it is manifest that various techniques can be used for implementing the concepts of the present invention without departing from its scope. Moreover, while the invention has been described with specific reference to certain embodiments, a person of ordinary skill in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

The invention claimed is:

1. A high electron mobility transistor (HEMT) comprising:
a first group III-V intrinsic layer;
a second group III-V intrinsic layer formed over said first group III-V intrinsic layer;
a group III-V semiconductor layer formed over said second group III-V intrinsic layer, said group III-V semiconductor layer and said second group III-V intrinsic layer forming a heterojunction for generating a two-dimensional electron gas (2DEG);
said first group III-V intrinsic layer doped with a rare earth additive, thereby producing an insulator layer reducing leakage of charge carriers from said 2DEG.

2. The HEMT of claim 1, wherein said first group III-V intrinsic layer is formed utilizing a technique selected from the group consisting of molecular beam epitaxy (MBE), metal-organic chemical vapor deposition (MOCVD), and hydride vapor phase epitaxy (HVPE).

3. The HEMT of claim 1, wherein said group III-V semiconductor layer comprises a group III-V ternary semiconductor.

4. The HEMT of claim 1, wherein said group III-V semiconductor layer comprises aluminum gallium nitride (AlGaN).

5. The HEMT of claim 1, wherein said second group III-V intrinsic layer comprises a group III-V binary semiconductor.

6. The HEMT of claim 1, wherein said second group III-V intrinsic layer comprises gallium nitride (GaN).

7. The HEMT of claim 1, wherein said insulator layer comprises said rare earth additive at a concentration greater than 0.0 atomic percent and less than or equal to 1.0 atomic percent.

8. The HEMT of claim 1, wherein said rare earth additive comprises a lanthanide of atomic number fifty-eight or greater.

9. The HEMT of claim 1, wherein said rare earth additive comprises a lanthanide selected from the group consisting of cerium (Ce), praseodymium (Pr), europium (Eu), erbium (Er), and thulium (Tm).

10. A method for fabricating a high electron mobility transistor (HEMT), the method comprising:
forming a first group III-V intrinsic layer;
doping said first group III-V intrinsic layer with a rare earth additive to produce an insulator layer;
forming a second group III-V intrinsic layer over said insulator layer;
forming a group III-V semiconductor layer over said second group III-V intrinsic layer, said group III-V semiconductor layer and said second group III-V intrinsic layer forming a hetero unction for generating a two-dimensional electron gas (2DEG);
said insulator layer reducing leakage of charge carriers from said 2DEG.

11. The method of claim 10, wherein forming said first group III-V intrinsic layer is performed utilizing a technique selected from the group consisting of molecular beam epitaxy (MBE), metal-organic chemical vapor deposition (MOCVD), and hydride vapor phase epitaxy (HVPE).

12. The method of claim 10, wherein said group semiconductor layer comprises a group III-V ternary semiconductor.

13. The method of claim 10, wherein said group III-V semiconductor layer comprises aluminum gallium nitride (AlGaN).

14. The method of claim 10, wherein said second group III-V intrinsic layer comprises a group III-V binary semiconductor.

15. The method of claim 10, wherein said second group III-V intrinsic layer comprises gallium nitride (GaN).

16. The method of claim 10, wherein doping said first group III-V intrinsic layer comprises doping with said rare earth additive to a concentration greater than 0.0 atomic percent and less than or equal to 1.0 atomic percent.

17. The method of claim 10, wherein said rare earth additive comprises a lanthanide of atomic number fifty-eight or greater.

18. The method of claim 10, wherein said rare earth additive comprises a lanthanide selected from the group consisting of cerium (Ce), praseodymium (Pr), europium (Eu), erbium (Er), and thulium (Tm).

* * * * *